(12) United States Patent
Enriquez

(10) Patent No.: US 6,469,519 B1
(45) Date of Patent: Oct. 22, 2002

(54) PRECISION LOOP VOLTAGE DETECTOR FOR SUBSCRIBER LINE INTERFACE CIRCUIT APPLICATIONS

(75) Inventor: Leonel Ernesto Enriquez, Melbourne Beach, FL (US)

(73) Assignee: Intersil Corporation, Palm Bay, FL (US)

( * ) Notice: Subject to any disclaimer, the term of this patent is extended or adjusted under 35 U.S.C. 154(b) by 34 days.

(21) Appl. No.: 09/686,324

(22) Filed: Oct. 11, 2000

(51) Int. Cl.[7] .................. G01R 23/20; G01R 27/00; G01R 31/02

(52) U.S. Cl. .................. 324/625; 324/600; 324/72

(58) Field of Search .................. 324/340, 512, 324/523, 537, 605, 625, 72, 600; 379/387, 400, 413

(56) References Cited

U.S. PATENT DOCUMENTS

| | | | | |
|---|---|---|---|---|
| 3,746,795 A | * | 7/1973 | Fitzsimons | 379/400 |
| 4,375,050 A | * | 2/1983 | Helgerson | 324/540 |
| 4,866,768 A | * | 9/1989 | Sinberg | 379/413 |
| 5,162,742 A | * | 11/1992 | Atkins et al. | 324/523 |
| 6,185,297 B1 | * | 2/2001 | Casselman | 379/387 |

* cited by examiner

Primary Examiner—Michael Sherry
Assistant Examiner—Paresh Patel
(74) Attorney, Agent, or Firm—Allen, Dyer, Doppelt, Milbrath & Gilchrist, PA

(57) ABSTRACT

A precision loop voltage measurement circuit outputs a voltage proportional to the differential voltage across a telephone wireline pair. This voltage is coupled to a tip-ring sense rectifier circuit having complementary transistor pairs coupled through a sense resistor to a node, which provides a current as of a composite of the tip-ring voltage and transistor voltage drops within the tip-ring sense rectifier circuit. A differential current extraction circuit generates a first current proportional to the sum of the tip-ring voltage plus voltage drops in the tip-ring sense rectifier circuit, and a second current fractionally proportional to only the internal voltage drops in the tip-ring sense rectifier circuit. The scaled currents are combined in an output resistor to produce a single ended output proportional to tip-ring voltage.

14 Claims, 1 Drawing Sheet

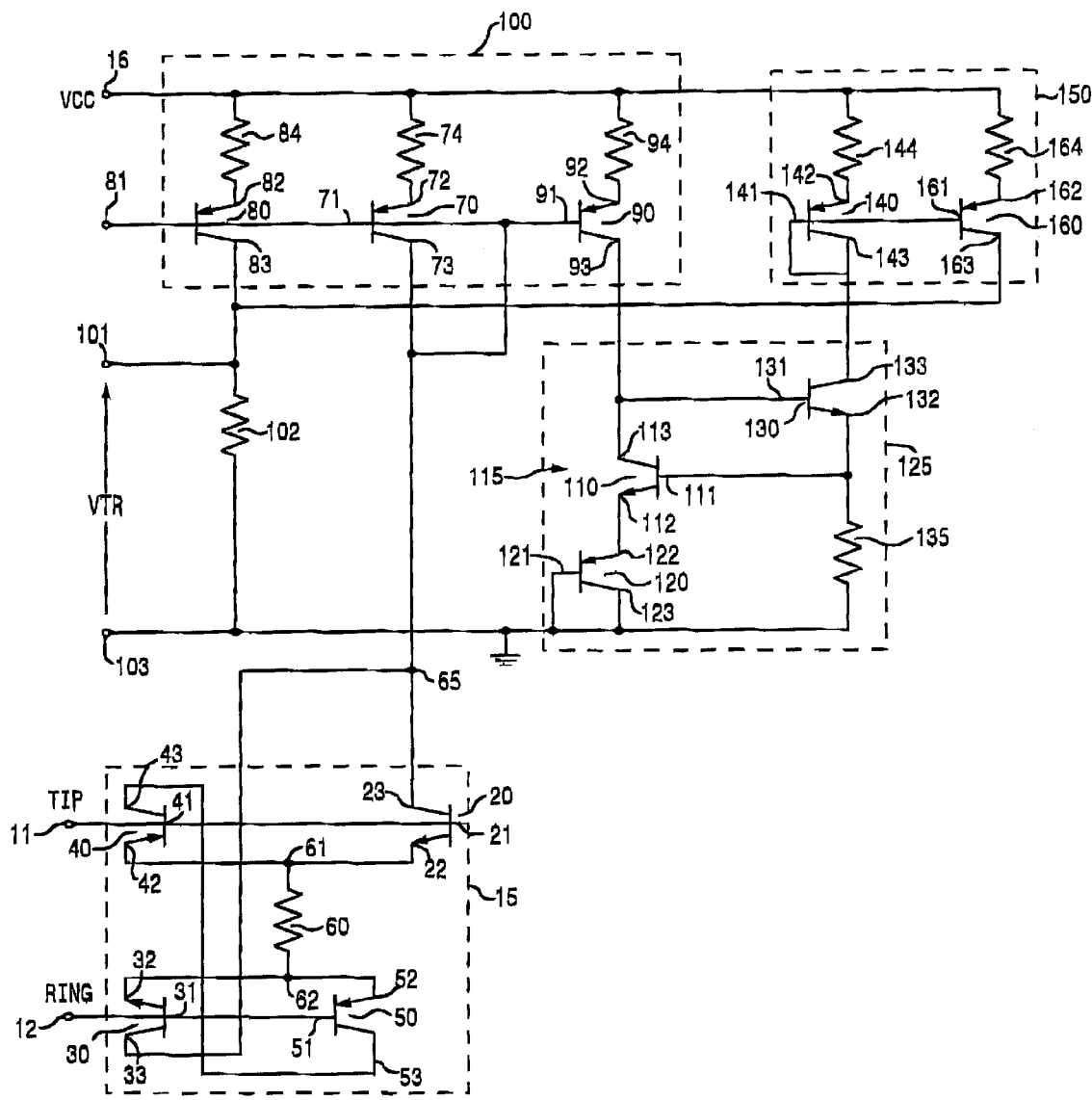

PRECISION LOOP VOLTAGE DETECTOR FOR SUBSCRIBER LINE INTERFACE CIRCUIT APPLICATIONS

FIELD OF THE INVENTION

The present invention relates in general to communication systems and components, and is particularly directed to a wireline voltage measurement circuit architecture, that is configured to generate a single ended output voltage that is very precisely proportional to the differential voltage across the tip and ring leads of a telephone wireline pair, at very low power consumption, making the voltage measurement circuit readily suited for incorporation into a subscriber line interface circuit (SLIC).

BACKGROUND OF THE INVENTION

Various equipments employed by telecommunication service providers employ what are known as subscriber line interface circuits or 'SLIC's, which interface (transmit and receive) communication signals with tip and ring leads of a (copper) wireline pair, to which a (remote) piece of subscriber equipment is connected. Not only is the wireline pair used to transport AC signals (e.g., voice and/or ringing), as well as substantial DC voltages, but its length can be expected to vary from installation to installation, and may be relatively long (e.g., on the order of multiple miles).

For optimized signal transmission and reception, the SLIC is designed to compensate for attenuation characteristics of the line. Because these attenuation characteristics strongly depend upon the length of the line, measuring the differential voltage across its tip and ring leads is usually performed to obtain an indication of line length. However, as this differential line voltage may be quite large, conventional loop voltage measurement circuits cannot be readily incorporated into present day, low voltage SLIC architectures, which are designed to be interfaced with a variety of telecommunication circuits including those providing digital codec functionality. This interface capability requires that the SLIC employ a transmission channel that conforms with a very demanding set of performance requirements, including accuracy, linearity, insensitivity to common mode signals, low power consumption, low noise, filtering, and ease of impedance matching programmability.

SUMMARY OF THE INVENTION

As will be described, the present invention provides a new and improved loop voltage measurement circuit architecture, that is configured to produce a single ended output voltage, which is very precisely proportional to the differential voltage across the tip and ring leads of a telephone wireline pair. In so doing, the present invention consumes very little power and is designed to conform with the above referenced constraints of present day SLICs.

For this purpose, respective tip and ring leads of a telecommunication wireline pair of interest are coupled to a tip-ring voltage detector comprised of a transistor-configured tip-ring sensing (full wave) rectifier circuit containing complementary bipolar transistor pairs. Such rectifying arrangement enables proper operation regardless of the relative voltage polarity of the tip and ring terminals. The complementary transistor pairs of the rectifier circuit are intercoupled through a relatively high valued tip-ring voltage sensing resistor (on the order of one megohm), and have a collector-emitter output path coupled to a rectified detection current node. This detection current node supplies a current containing a composite of two voltage-representative components to a differential current extraction circuit. The first voltage-representative current component is representative of the differential tip-ring voltage (which is desired). The second voltage-representative current component is associated with the internal characteristics (base-emitter voltage drops of complementary transistors) of the tip-ring voltage detector (which constitutes an undesired offset).

The differential current extraction circuit serves to separate the second current component from the composite current. Each of the second current component and the composite current is then appropriately scaled, so that when differentially recombined, the scaled version of the second voltage-representative current component (which is associated with the internal characteristics of the tip-ring voltage detector) is canceled from the composite current, leaving only the first component representative of the differential tip-ring voltage.

For this purpose, the differential current extraction circuit contains a pair of current mirror circuits, one of which is a three port current mirror and generates a first current component that is fractionally proportional to the sum of the differential tip-ring voltage, plus the base-emitter voltage drops of the complementary pair of transistors of the tip-ring sense rectifier circuit. The other current mirror circuit is a two port current mirror that generates a second current component that is fractionally proportional to only the base-emitter voltage drops of the complementary pair of transistors of the tip-ring sense rectifier circuit.

One current mirror output port of the three-port current mirror is coupled to a single ended tip-ring voltage measurement node, to which a ground-referenced, voltage-dropping, output-scaling resistor is coupled. This output-scaling resistor has a resistance value that is a prescribed fraction of the value of the tip-ring sense resistor. A second current mirror output port of the three-port current mirror is coupled to an auxiliary voltage reference circuit, that is comprised of a pair of series-connected, complementary transistors that are coupled across a relatively large valued scaling resistor (which may have a value on the order of half that of the tip-ring sensing resistor).

The geometries (emitter areas) of the transistors of the auxiliary voltage reference are such that they operate at the same current densities as the transistor pairs of the tip-ring sensing rectifier. As a result, the output voltage produced by the auxiliary voltage reference is representative of only the base-emitter voltage drops of one of the complementary pairs of transistors of the rectifier. Therefore, the resultant current flowing through the scaling resistor, across which the voltage output of the auxiliary voltage reference is impressed, is representative of only the base-emitter voltage drops of a complementary pair of transistors of the rectifier.

By appropriately scaling and differentially combining this current with the current mirrored at the second port of the three-port current mirror (which is representative of the composite of the differential tip-ring voltage, plus the base-emitter voltage drops of a complementary pair of transistors of the rectifier), a resultant current representative of only the differential tip-ring voltage is obtained.

For this purpose, the current through the scaling resistor of the auxiliary voltage reference is coupled through a level shift transistor to a first (input) port of a two-port current mirror. A second (current mirror) port of the two port current mirror outputs a mirrored and attenuated current (which is representative of only the base-emitter voltage drops of a complementary pair of transistors of the rectifier) to the single ended tip-ring voltage measurement node. The scaling factor of this current is defined so as to have the same magnitude as the base-emitter voltage drop representative component of the mirrored current at the second (current mirror) port of the three-port current mirror, which is also coupled to the single ended tip-ring voltage measurement node.

The summing of the two mirrored and scaled currents at the single ended tip-ring voltage measurement node results in the base-emitter voltage drop components canceling one another, so as to produce a net output current through the voltage-dropping output-scaling resistor that is representative of only the differential tip-ring voltage, as desired.

BRIEF DESCRIPTION OF THE DRAWINGS

The single FIGURE is a schematic illustration of a non-limiting embodiment of a precision loop voltage detector circuit in accordance with the present invention.

DETAILED DESCRIPTION

Referring now to the single FIGURE of drawings, the precision loop voltage detector circuit of the present invention is schematically illustrated as comprising tip and ring terminals 11 and 12, that are adapted to be coupled to respective TIP and RING leads of a telecommunication wireline pair of interest. In order to sense the differential loop voltage across the wireline pair, the terminals 11 and 12 are coupled to a transistor-configured full wave rectifier circuit 15, which contains complementary bipolar transistor pairs, comprised of NPN bipolar transistors 20, 30 and PNP transistors 40, 50, each transistor having a relatively high beta ($\beta$). The complementary pairs are interconnected through a relatively high valued tip-ring sense resistor 60 having a resistance value of $R_{60}$ (e.g, on the order of one megohm).

In particular, the tip node 11 is coupled to the base 21 of NPN transistor 20 and to the base 41 of PNP transistor 40, while the ring node 12 is coupled to the base 31 of NPN transistor 30 and to the base 51 of PNP transistor 50. The emitter 22 of transistor 20 and the emitter 42 of transistor 40 are coupled in common with a first end 61 of resistor 60, while the emitter 32 of transistor 30 and the emitter 52 of transistor 50 are coupled in common with a second end 62 of resistor 60. The collector 23 of transistor 20 is coupled in common with the collector 33 of transistor 30 and to a tip-ring current measurement output node (or detection current node) 65, while the collector 43 of transistor 40 is coupled in common with the collector 53 of transistor 50.

Current measurement output node 65 is coupled as an input current to the collector 73 of a PNP transistor 70 of a first, three-port, current mirror 100. Transistor 70 is diode-connected with its emitter 72 coupled through resistor 74 to (VCC) power supply rail 16, and its base 71 and collector 73 coupled in common with the base 81 of a PNP current mirror transistor 80 and with the base 91 of a PNP current mirror transistor 90. Like the transistors of the rectifier circuit 15, each of current mirror transistors 80 and 90 has a relatively high beta ($\beta$).

Current mirror transistor 80 has its emitter 82 coupled through resistor 84 to the (VCC) power supply rail 16, and its collector 83 providing a mirrored output current to a tip-ring voltage measurement node 101. A voltage dropping resistor 102 is coupled between node 101 and a ground (GND) reference terminal 103. Resistor 102 may have a value $R_{102}$ that is a prescribed fraction (e.g., ⅒) of the value $R_{60}$ of resistor 60 in the tip-ring sense rectifier 15. The current mirror transistor 90 has its emitter 92 coupled through resistor 94 to VCC power supply rail 16, and its collector 93 providing a mirrored output current to the collector 113 of an NPN transistor 110 within an auxiliary voltage reference circuit 115 within an auxiliary current generator circuit 125.

As described briefly above, auxiliary voltage reference circuit 115 is configured to produce an output voltage that is representative of only the base-emitter voltage drops of one of the complementary pairs of transistors of the rectifier circuit 15. For this purpose, NPN transistor 110 has its emitter 112 coupled to the emitter 122 of a diode-connected PNP transistor 120, the base 121 and collector 123 of which are coupled to ground terminal 103. The geometries (emitter areas) of transistors 110 and 120 are designed so as to operate at the same current densities as transistor pairs 20/50 or 30/40. The base 111 of transistor 110 is coupled to the emitter 132 of NPN level shift transistor 130 and through a scaling resistor 135 to ground. Resistor 135 may have a value $R_{135}$ on the order of one-half of the value $R_{60}$ of resistor 60 (i.e., $R_{135}=R_{60}/2$).

As noted earlier, and as will be described in detail below, the output voltage produced by the auxiliary voltage reference circuit 115 is representative of only the base-emitter voltage drops of one of the complementary pairs of transistors of the rectifier circuit 15. Consequently, a resultant auxiliary current flowing through the scaling resistor 135 is representative of only the base-emitter voltage drops of a complementary pair of transistors of the rectifier circuit 15. By appropriately scaling and differentially combining this auxiliary current with the composite current mirrored by current mirror transistor 80 of three-port current mirror 100 (which is representative of the composite of the differential tip-ring voltage, plus the base-emitter voltage drops of a complementary pair of transistors of the rectifier), a resultant current representative of only the differential tip-ring voltage can be obtained.

In order to scale the auxiliary current through resistor 135, the base 131 of transistor 130 is coupled to the collector 113 of transistor 110, and its collector 133 coupled to the base 141 and collector 143 of a diode-connected current mirror PNP transistor 140 within a second, two-port current, mirror 150. Transistor 140 has its emitter 142 coupled through resistor 144 to the VCC rail 16, and its base 141 coupled in common with the base 161 of a current mirror transistor 160. Current mirror transistor 160 has its emitter 162 coupled through a resistor 164 to the VCC rail 16 and its collector 163 coupled to tip-ring voltage measurement node 101.

As will be described, current mirror transistor 160 supplies to node 101 a mirrored current representative of only the base-emitter voltage drops of a complementary pair of transistors of the rectifier. Summing the two mirrored and scaled currents at the single ended tip-ring voltage measurement node 101 results in the base-emitter voltage drop components canceling one another, so as to produce a net output current through the voltage-dropping output-scaling resistor 103 that is representative of only the differential tip-ring voltage ($V_{TIP}-V_{RING}$)

The loop voltage detector of the present invention operates as follows.

In the transistor-configured full wave rectifier circuit 15, when the voltage $V_{TIP}$ at the TIP node 11 is more positive than the voltage $V_{RING}$ at the RING node 12, the current $I_{60}$ flowing through resistor 60 may be defined as:

$$I_{60}=(V_{TIP}-V_{RING}-V_{BE20}-V_{BE50})/R_{60}, \quad (1)$$

where $V_{VBE20}$ and $V_{VBE50}$ are the respective base-emitter voltages of transistors 20 and 50.

Conversely, when the voltage $V_{TIP}$ at the TIP node 11 is more negative than the voltage $V_{RING}$ at the RING node 12, the current $I_{60}$ flowing through resistor 60 may be defined as:

$$I_{60}=(V_{RING}-V_{TIP}-V_{BE30}-V_{BE40})/R_{60}, \quad (2).$$

where $V_{VE30}$ and $V_{VE40}$ are the respective base-emitter voltages of transistors 30 and 40.

Since the current mirror transistors 80 and 90 of three-port current mirror 100 have relatively high betas, the current $I_{60}$ flowing through resistor 60 and appearing at tip-ring current measurement node 65 flows through the collector-emitter path of transistor 70, and therefrom through resistor 74. The current $I_{60}$ through transistor 70 is mirrored and attenuated by current mirror transistor 90 and its associated emitter resistor 94 in accordance with the ratios of their emitter resistors and transistor emitter areas (by a factor $K_{90}=4$, as a non-limiting example). The current $I_{60}$ through transistor 70 is further mirrored and attenuated by the current mirror transistor 80 and its emitter resistor 84 by a prescribed factor $K_{80}$ (e.g., $K_{80}=2.5$), and applied to the tip-ring voltage measurement node 101, as a composite current $I_{80}$ representative of the combined differential tip-ring voltage, plus the base-emitter voltage drops of a complementary pair of transistors of the rectifier circuit 15.

As noted earlier, the emitter areas $A_E$ of transistors 110 and 120 of the auxiliary voltage reference circuit 115 are designed so as to operate at the same current densities as transistor pairs 20/50 or 30/40 in tip-ring voltage rectifier circuit 15 (i.e., $A_{E110}=A_{E20}/4=A_{E30}/4$; $A_{E120}=A_{E50}/4=A_{E40}/4$). As a consequence, $$V_{BE110}=(kT/q)ln(I_{60}/4J_{SN}A_{E110})=V_{BE20}=(kT/q)ln(I_{60}/J_{SN}A_{E20})=V_{BE50}=(kT/q)ln(I_{60}/J_{SN}A_{E50}),$$

and $$V_{BE120}=(kT/q)ln(I_{60}/4J_{SP}A_{E120})=V_{BE30}=(kT/q)ln(I_{60}/J_{SP}A_{E30})=V_{BE40}=(kT/q)ln(I_{60}/J_{SP}A_{E40}). \quad (3)$$

As can be seen from the Figure, the sum of the base-emitter voltages $V_{BE110}+V_{BE120}$ of transistors 110 and 120, respectively, is applied across scaling resistor 135, and the current $I_{135}=(V_{BE110}+V_{BE120})/R_{135}$ therethrough is level shifted by transistor 130 into the collector-emitter path current mirror transistor 140 of two-port current mirror 150.

This current $I_{135}$ is mirrored and attenuated by current mirror transistor 160 and resistor 164 by a prescribed factor $K_{150}$ and applied to the tip-ring voltage measurement node 101. As described above, the mirrored output current $I_{80}$ of current mirror transistor 80 is also applied to the tip-ring voltage measurement node 101. Thus, the current supplied to node 101 and thereby through resistor 102 is the sum of the currents mirrored by current mirror transistors 80 and 160 of respective current mirrors 100 and 150.

From the previous relationships, the expression for the current $I_{135}=(V_{BE110}+V_{BE120})/R_{135}$ may be also be written as:

$$I_{135}=(V_{BE20}+V_{BE50})/R_{135}=(V_{BE30}+V_{BE40})/R_{135} \quad (4)$$

Therefore, the mirrored current component $I_{160}$ flowing through the collector-emitter path of transistor 160 in the two-port current mirror 150 may be expressed as:

$$I_{160}=(1/K_{150})*(V_{BE20}+V_{BE50})R_{135}, \text{ or } I_{160}=(2/K_{150})*(V_{BE20}+V_{BE50})/R_{60}, \quad (5)$$

since resistor 135 may have a value $R_{135}$ on the order of one-half of the value $R_{60}$ of resistor 60 (i.e., $R_{135}=R_{60}/2$), as noted earlier.

The mirrored current component $I_{80}$ through the collector-emitter path of transistor 80 in the three-port current mirror 100 may be expressed as:

$$I_{80}=(1/K_{80})*(I_{60})=(V_{TIP}-V_{RING}-V_{BE20}-V_{BE50})/(K_{80}R_{60}) \quad (6)$$

The voltage VTR across nodes 101–103 is the product of the value $R_{102}$ of resistor 102 and the summation of the two mirrored currents $I_{80}$ and $I_{160}$ injected into node 101; namely, $$VTR=(I_{160}+I_{80})*(R_{102}), \text{ or}$$

with resistor 102 having a value $R_{102}$ that is a prescribed fraction (e.g., ⅒) of the value $R_{60}$ of resistor 60, as described above, then $$VTR=(I_{160}+I_{80})*(R_{60}/10) \quad (7).$$

Letting $K_{80}=K_{150}/2$, and substituting equations (5) and (6) into equation (7) yields:

$$VTR=[(V_{TIP}-V_{RING}-V_{BE20}-V_{BE50})/(K_{80}R_{60})+[(V_{BE20}+V_{BE50})/(K_{80}R_{60})]*(R_{60}/10), \text{ or}$$

$$VTR=(V_{TIP}-V_{RING})/10K_{80} \quad (8).$$

Thus, summing the two mirrored and scaled currents $I_{80}$ and $I_{160}$ at the single ended tip-ring voltage measurement node 101 results in the base-emitter voltage drop representative components canceling one another, leaving a net current $I_{103}$ through the voltage-dropping output-scaling resistor 103 that is representative of only the differential tip-ring voltage. As a consequence, the voltage VTR produced at node 101 (relative to ground-referenced node 103) is a precise fraction of only the voltage differential ($V_{TIP}-V_{RING}$), irrespective of the relative values of the voltages at the tip and ring terminals.

It should be noted that the tip-ring voltage scaling factor of ⅒$K_{80}$ of equation (8) is a non-limiting example, and not to be considered limitative of the invention. The measured loop voltage scaling factor can be set as desired with the appropriate choice of the values of components, including the value $R_{102}$ of the resistor 102, across which the voltage VTR is derived, relative to the value $R_{60}$ of the resistor 60 of transistor rectifier circuit 15, through which the differential tip-ring voltage is sensed, as described above.

As will be appreciated from the foregoing description, by differentially combining the mirrored and scaled current outputs of respective current mirrors, one of which is representative of the composite of the differential tip-ring voltage, plus the base-emitter voltage drops of a complementary pair of transistors of a tip-ring sense rectifier, and the other of which is representative of only the base-emitter voltage drops of a complementary pair of transistors of a tip-ring sense rectifier, the loop voltage measurement circuit architecture of the present invention produces a single ended output voltage, which is very precisely proportional to the differential voltage across the tip and ring leads of a telephone wireline pair. This circuit architecture consumes very little power and is designed to conform with the above referenced constraints of present day SLICs.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art. A similar implementation can be obtained using complementary MOSFET devices. The analysis set forth above is effectively equivalent for an MOSFET-implemented architecture, with base-emitter voltages in the bipolar relationships being replaced by gate-to-source voltages.

What is claimed is:

1. A-loop voltage measurement circuit for producing an output proportional to the differential tip-ring voltage across tip and ring leads of a telephone wireline pair comprising:

tip and ring ports, adapted to be respectively coupled to said tip and ring leads of said telephone wireline pair;

a tip-ring voltage detector coupled to said tip and ring ports, and being operative to produce at a current output node thereof an output current representative of the composite of said differential tip-ring voltage and a voltage associated with internal characteristics of said tip-ring voltage detector;

a differential current extraction circuit coupled to said current output node, and being operative to generate a first current component that is fractionally proportional to said output current produced at said current output node of said tip-ring voltage detector, and a second current component that is fractionally proportional to said voltage associated with internal characteristics of said tip-ring voltage detector; and an output node coupled to receive a combination of said first and second current components generated by said differential current extraction circuit and to produce a tip-ring voltage representative output current representative of only said differential tip-ring voltage.

2. The loop voltage measurement circuit according to claim 1, further including an output resistor coupled to receive said tip-ring voltage representative output current and to produce thereacross an output voltage representative of only said differential tip-ring voltage.

3. The loop voltage measurement circuit according to claim 1, wherein said tip-ring voltage detector is configured as a tip-ring sense rectifier circuit containing complementary transistor pairs coupled to said tip and ring ports, and being intercoupled through a tip-ring voltage sensing resistor, so as to produce said output current as representative of the composite of a rectified differential tip-ring voltage, plus base-emitter voltage drops of a complementary pair of said transistors of said tip-ring sense rectifier circuit, and wherein said differential current extraction circuit is operative to generate said first current component in proportion to the sum of the differential tip-ring voltage plus the base-emitter voltage drops of said complementary pair of transistors of said tip-ring sense rectifier circuit, and said second current component as fractionally proportional to only said base-emitter voltage drops of said complementary pair of transistors of said tip-ring sense rectifier circuit.

4. The loop voltage measurement circuit according to claim 3, wherein said differential current extraction circuit comprises a first current mirror circuit, coupled to said output node and being operative to generate said first current component, an auxiliary voltage reference circuit, coupled to receive a mirrored current from said first current mirror circuit and being operative to produce an auxiliary current that is fractionally proportional to only the base-emitter voltage drops of said complementary pair of transistors of said tip-ring sense rectifier circuit, and a second current mirror circuit coupled to mirror and attenuate said auxiliary current as said second current component.

5. The loop voltage measurement circuit according to claim 4, wherein said auxiliary voltage reference circuit comprises an interconnected pair of complementary transistors having characteristics such that they operate at the same current densities as complementary transistor pairs of the tip-ring sensing rectifier, and generate said auxiliary reference voltage as representative of only base-emitter voltage drops of said one of said complementary pairs of transistors of said tip-ring sense rectifier circuit, and a scaling resistor coupled to receive said auxiliary reference voltage thereacross and to produce said auxiliary current.

6. The loop voltage measurement circuit according to claim 4, wherein said first current mirror circuit has an input port coupled to said output node, a first current mirror port supplying said first current component, and a second current mirror port coupled to said auxiliary voltage reference circuit, and wherein said second current mirror has an input port coupled to receive said auxiliary current and a current mirror port coupled to mirror and attenuate said auxiliary current as said second current component.

7. A method of deriving a single ended output proportional to the differential tip-ring voltage across tip and ring leads of a telephone wireline pair comprising the steps of:

(a) sensing, by means of a tip-ring voltage detector coupled to said tip and ring leads, a differential voltage across said tip and ring leads of said telephone wireline pair and producing a tip-ring voltage-associated output current representative of the composite of said differential voltage and a voltage associated with internal characteristics of said tip-ring voltage detector;

(b) generating a first current component that is fractionally proportional to said tip-ring voltage-associated output current, and a second current component that is fractionally proportional to said voltage associated with internal characteristics of said tip-ring voltage detector; and (c) combining said first and second current components generated in step (b) to produce an output current representative of only said differential tip-ring voltage.

8. The method of according to claim 7, wherein step (c) further includes coupling said output current to an output resistor, which generates thereacross an output voltage representative of only said differential tip-ring voltage.

9. The method of according to claim 7, wherein step (a) comprises sensing the differential voltage across said tip and ring leads of said telephone wireline pair through complementary transistor pairs of a transistor-configured tip-ring sensing rectifier circuit, said complementary transistor pairs being intercoupled through a tip-ring voltage sensing resistor, and producing a tip-ring voltage-representative output current representative of the composite of a rectified differential tip-ring voltage, plus base-emitter voltage drops of a complementary pair of said transistors of said tip-ring sense rectifier circuit, and wherein (b) generating said first current component as fractionally proportional to the sum of the differential tip-ring voltage plus the base-emitter voltage drops of said complementary pair of transistors of said tip-ring sense rectifier circuit, and said second current component as fractionally proportional to only said base-emitter voltage drops of said complementary pair of transistors of said tip-ring sense rectifier circuit.

10. The method according to claim 9, wherein step (b) comprises coupling said tip-ring voltage-representative output current to a first current mirror circuit, and producing therefrom a first mirrored current as said first current component, and a second mirrored current, and producing from said second mirrored current an auxiliary current that is proportional to only base-emitter voltage drops of said complementary pair of transistors of said tip-ring sense rectifier circuit, and generating said second current component in accordance with said auxiliary current.

11. The method circuit according to claim 10, wherein said auxiliary current is produced by an auxiliary voltage reference circuit comprising an interconnected pair of complementary transistors having characteristics such that they operate at the same current densities as complementary transistor pairs of the tip-ring sensing rectifier, said auxiliary voltage reference circuit generating an auxiliary reference voltage representative of only base-emitter voltage drops of said one of said complementary pairs of transistors of said tip-ring sensing rectifier circuit, and wherein said auxiliary current is generated by a scaling resistor coupled to receive said auxiliary reference voltage thereacross.

12. A loop voltage measurement circuit for producing an output proportional to the differential voltage across tip and ring leads of a telephone wireline pair comprising:

tip and ring ports, adapted to be respectively coupled to said tip and ring leads of said telephone wireline pair;

a transistor-configured tip-ring sensing rectifier circuit coupled to said tip and ring ports, and containing complementary bipolar transistor pairs intercoupled through a tip-ring voltage sensing resistor and having a collector-emitter output path coupled to a detection current node, said detection current node providing a tip-ring voltage associated current representative of a composite of the differential tip-ring voltage and base-emitter voltage drops of complementary transistors of said tip-ring sensing rectifier circuit;

a differential current extraction circuit coupled to said detection current node, and being operative to generate a first scaled current in proportion to the sum of the differential tip-ring voltage plus the base-emitter voltage drops of said complementary pair of transistors of said tip-ring sense rectifier circuit, and a second scaled current that is fractionally proportional to only said base-emitter voltage drops of said complementary pair of transistors of said tip-ring sense rectifier circuit; and an output resistor coupled to receive a combination of said first and second scaled currents and to produce thereacross an output voltage representative of only said differential tip-ring voltage.

13. A loop voltage measurement circuit according to claim 12, wherein said differential current extraction circuit comprises a first current mirror circuit, coupled to said output node and being operative to generate said first scaled current, an auxiliary voltage reference circuit, coupled to receive a mirrored current from said first current mirror circuit and being operative to produce an auxiliary current that is fractionally proportional to only the base-emitter voltage drops of said complementary pair of transistors of said tip-ring sense rectifier circuit, and a second current mirror circuit coupled to mirror and attenuate said auxiliary current as said second scaled current.

14. A loop voltage measurement circuit according to claim 13, wherein said auxiliary voltage reference circuit comprises complementary transistors having collector-emitter paths thereof coupled to receive said mirrored current from said first current mirror, and whose geometries are such that they operate at the same current densities as complementary transistor pairs of said transistor-configured tip-ring sensing rectifier circuit, so as to produce an auxiliary voltage reference that is representative of only the base-emitter voltage drops of a complementary pair of transistors of said rectifier circuit, said auxiliary voltage being coupled to a scaling resistor to produce said auxiliary current representative of only the base-emitter voltage drops of said complementary pair of transistors of said rectifier circuit.

* * * * *